(12) United States Patent
Stephenson

(10) Patent No.: US 11,982,685 B2
(45) Date of Patent: May 14, 2024

(54) PRE-FABRICATED MOVABLE WALK-IN CHAMBER FOR TESTING SECONDARY CELLS

(71) Applicant: Northvolt AB, Stockholm (SE)

(72) Inventor: Sean Stephenson, Bureå (SE)

(73) Assignee: Northvolt AB, Stockholm (SE)

( * ) Notice: Subject to any disclaimer, the term of this patent is extended or adjusted under 35 U.S.C. 154(b) by 0 days.

(21) Appl. No.: 18/072,953

(22) Filed: Dec. 1, 2022

(65) Prior Publication Data
US 2023/0168276 A1 Jun. 1, 2023

(30) Foreign Application Priority Data
Dec. 1, 2021 (SE) .................... 2151463-3

(51) Int. Cl.
*G01R 1/04* (2006.01)
*G01R 31/36* (2020.01)

(52) U.S. Cl.
CPC ....... *G01R 1/0408* (2013.01); *G01R 31/3644* (2013.01)

(58) Field of Classification Search
CPC .............. G01R 1/0408; G01R 31/3644; G01R 31/385; G01R 31/396; H01M 10/44; H01M 10/4285; G05B 23/0237; Y02E 60/10
(Continued)

(56) References Cited

U.S. PATENT DOCUMENTS

| 2006/0214637 A1* | 9/2006 | Gonzales | .............. | B60L 53/305 320/128 |
| 2021/0223321 A1* | 7/2021 | Kervinen | .............. | G01R 31/385 |

FOREIGN PATENT DOCUMENTS

| CN | 110542860 A | * | 6/2019 | ............ | G01N 31/36 |
| CN | 110542860 A | | 12/2019 | | |

(Continued)

OTHER PUBLICATIONS

Office Action for Swedish Patent Application No. 2151463-3, dated Jul. 15, 2022, (6 pages), Swedish Patent and Registration Office, Stockholm, Sweden.

(Continued)

*Primary Examiner* — Alexander Satanovsky
*Assistant Examiner* — Trung Q Nguyen
(74) *Attorney, Agent, or Firm* — Alston & Bird LLP

(57) ABSTRACT

The present disclosure generally pertains to testing of secondary batteries. More specifically, the disclosure relates to a movable walk-in chamber for testing secondary cells. According to a first aspect, the present disclosure relates to a movable walk-in chamber for testing secondary cells comprising an enclosure, racking, a plurality of cycler interfaces and cabling. The enclosure form at least one thermally isolated temperature chamber. Furthermore, the enclosure comprises a walking aisle arranged between an entrance and an exit. The racking is arranged at inner walls of the enclosure along the walking aisle. Secondary cells can be inserted in the racking for testing and removed after testing. The plurality of cycler interfaces are arranged at outer walls of the enclosure. Each cycler interface comprises a power interface and one or more cell interfaces. The cabling is arranged to connect the power interfaces to at least one central power connector, whereby cyclers connected to the cycler interfaces can be powered from the movable walk-in chamber. The cabling is also arranged to connect the cell interfaces to poles of secondary cells inserted in the racking, whereby cyclers connected to the cycler interfaces are able to perform testing on cells arranged in the racking.

21 Claims, 5 Drawing Sheets

(58) Field of Classification Search
USPC .................................................. 324/425–434
See application file for complete search history.

(56) References Cited

FOREIGN PATENT DOCUMENTS

| CN | 113571820 A | 10/2021 |
|---|---|---|
| DE | 10-2018-114183 A1 | 12/2019 |
| EP | 3579008 A1 | 12/2019 |

OTHER PUBLICATIONS

Final Notice for Swedish Patent Application No. 2151463-3, dated Sep. 1, 2022, (32 pages), Swedish Patent and Registration Office, Stockholm, Sweden.

Notification of Intention to Grant A Patent for Swedish Patent Application No. 2151463-3, dated Sep. 1, 2022, (3 pages), Swedish Patent and Registration Office, Stockholm, Sweden.

Extended European Search Report for European Patent Application No. 22208904.7, dated Mar. 15, 2023, (6 pages), European Patent Office, Munich Germany.

International Search Report and Written Opinion for International Application No. PCT/EP2022/082856, dated Mar. 15, 2023, (14 pages), European Patent Office, Rijswijk, Netherlands.

"Battery Test Chambers," Angelantoni Test Technologies, Jan. 30, 2020, (16 pages), XP093023550, available online: https://tprofile.pl/wp-content/uploads/2020/02/ACS_BatteryTestChambers.pdf.

"Environmental Chambers for Battery Testing," CSZ a GenTherm Company, Nov. 8, 2017, (12 pages), XP093023555, available online: http://www.cszindustrial.com/portals/1/pdf/battery_test_chambers1.pdf.

\* cited by examiner

PRIOR ART

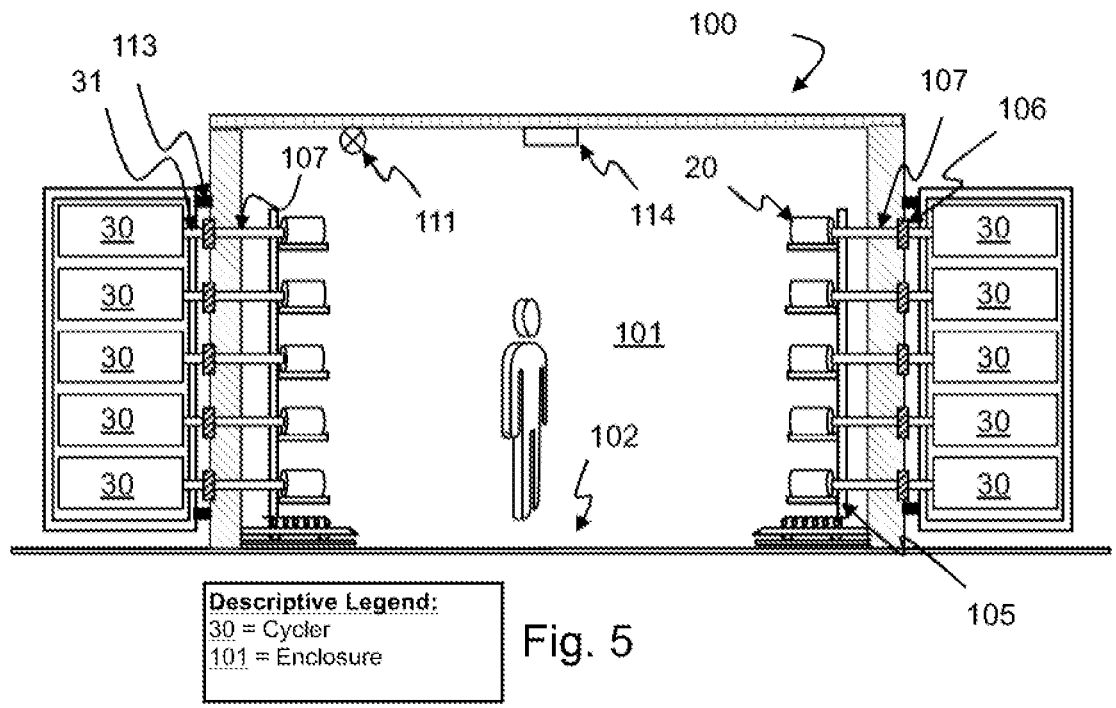
Fig. 5
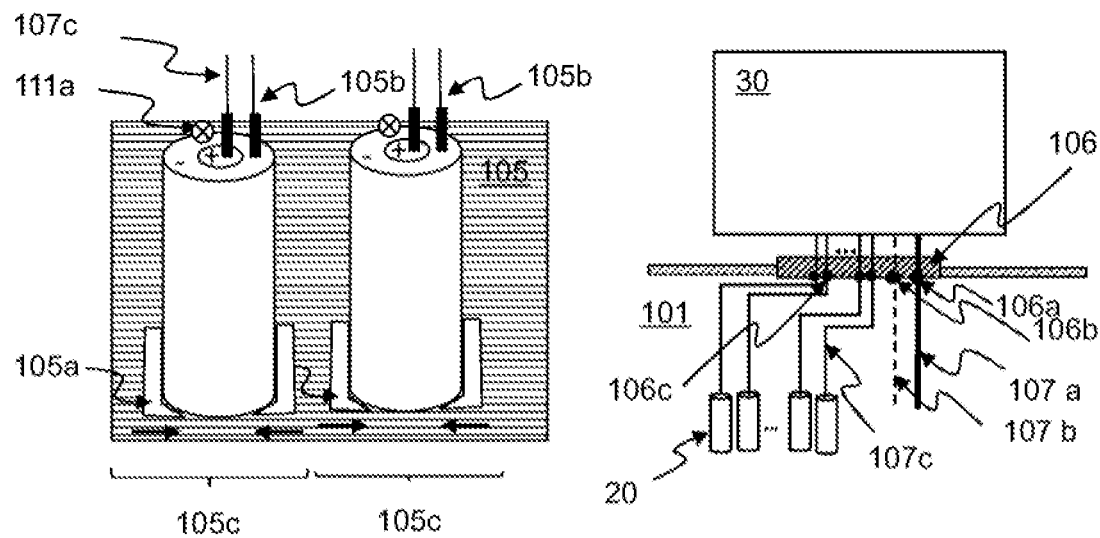
Fig. 6
Fig. 7

PRE-FABRICATED MOVABLE WALK-IN CHAMBER FOR TESTING SECONDARY CELLS

CROSS-REFERENCE TO RELATED APPLICATIONS

The present disclosure claims priority to and the benefit of Swedish Patent Application No. 2151463-3, filed Dec. 1, 2021; the contents of which as are hereby incorporated by reference herein in their entirety.

TECHNICAL FIELD

The present disclosure generally pertains to testing of secondary batteries. More specifically, the disclosure relates to a movable walk-in chamber for testing secondary cells.

BACKGROUND

In addressing climate change there is an increasing demand for rechargeable batteries, e.g. to enable electrification of transportation and to supplement renewable energy. Currently, lithium-ion batteries are becoming increasingly popular. Lithium-ion batteries represent a type of rechargeable battery in which lithium ions move from the negative electrode to the positive electrode during discharge and back when charging.

A rechargeable battery, also referred to as a secondary battery, comprises one or more secondary cells, for example lithium-ion cells. During production of secondary cells, test procedures need to be performed in order to obtain essential characteristics of the lithium-ion cells regarding capacity, power density, energy density, storage life and cycle life. These tests are commonly referred to as Performance and Life-cycle, P&L, tests.

FIG. 1 illustrates a P&L test environment that is commonly used today, where testing is performed by attaching secondary cells placed in a controlled test environment, such as a temperature chamber, to a battery tester (commonly called cycler 30) placed next to the temperature chamber 200, as illustrated in FIG. 1. Capacity of a setup comprising one or more cyclers 30 and a temperature chamber 200 is typically less than 100 cells.

Due to mass scale production and increased quality requirements it is foreseen that within a near future mass scale P&L testing will be required at the manufacturing site. This will generate new demands on the P&L testing, such as equipment efficiency, footprint in factory, energy efficiency, installation time and cost. Hence, there is a need for improved arrangements that enable and facilitate mass scale P&L testing.

SUMMARY

The present disclosure aims at facilitating mass scale P&L testing. Thus, it is an object of the disclosure to provide an optimised lab for testing secondary cells, which is energy efficient, has small footprint in the factory and that enables fast and easy installation.

According to a first aspect, the present disclosure relates to a movable walk-in chamber for testing secondary cells comprising an enclosure, racking, a plurality of cycler interfaces and cabling. The enclosure form at least one thermally isolated temperature chamber. Furthermore, the enclosure comprises a walking aisle arranged between an entrance and an exit. The racking is arranged at inner walls of the enclosure along the walking aisle. Secondary cells can be inserted in the racking for testing and removed after testing. The plurality of cycler interfaces are arranged at outer walls of the enclosure. Each cycler interface comprises a power interface and one or more cell interfaces. The cabling is arranged to connect the power interfaces to at least one central power connector, whereby cyclers connected to the cycler interfaces can be powered from the movable walk-in chamber. The cabling is also arranged to connect the cell interfaces to poles of secondary cells inserted in the racking, whereby cyclers connected to the cycler interfaces are able to perform testing on cells arranged in the racking. The proposed walk-in chamber may be referred to as a "super chamber" as it enables testing a large number of cells in a small area. Thereby, the testing can be made faster and in a more controlled way. By introducing racking positioned along a walking aisle, secondary cells are stored in an efficient way, while they are at the same time easily accessible. This implies that continuous insertion and removal of cells is enabled, even when testing of other cells is ongoing. Because the cyclers are placed outside the thermally isolated chamber(s), excess heat from testing will not influence the temperature inside the chamber, whereby temperature control is facilitated. The cycler interfaces also provides flexibility in terms of possibility to use different types of cyclers and also to tailor the racking for different types of secondary cells. As the entire lab, apart from the cyclers, is integrated in one enclosure, the test lab may be pre-fabricated, which enables fast installation. Installation is further facilitated by the central power connection concept, due to the plug and play design.

In some embodiments, each cycler interface comprises a communication interface. In these embodiments, the movable walk-in chamber comprises cabling arranged to connect each communication interface to a control arrangement controllable by a central user interface, whereby cyclers connected to the cycler interfaces can be controlled by the central user interface. The central user interface enables efficient testing, as testing of a large number of cells (e.g. thousands) inserted in the racking may be controlled by one single user interface.

In some embodiments, the cabling is arranged to form a connection between the individual power interfaces, such that energy recovered when discharging one secondary cell can be used to charge another secondary cell. By reusing surplus energy generated by one cycler, overall energy efficiency may be enhanced.

In some embodiments, the enclosure has a size of at least 10(l)*6(w)*2(h) meters. Thereby, the movable walk-in chamber can accommodate thousands of secondary cells and people can enter and exit the movable walk-in chamber.

In some embodiments, the cycler interfaces are distributed along the outer walls of the enclosure with a certain distance, corresponding to the width of one cycler, in-between. Hence, cyclers may be distributed around the enclosure without need for extensive external cabling. A consequence is that installation is facilitated and that faulty couplings caused by tangled cabling is avoided.

In some embodiments, the racking comprises a cell fixturing mechanism for fixating secondary cells in the racking and an electrical connector providing an electrical connection between the cycler interfaces and secondary cells fixated in the cell fixturing mechanism. The cell fixturing mechanism provides secure docketing of the secondary cells during testing, whereby test quality is enhanced.

In some embodiments, the racking is configured to receive at least 500 or at least 1000 secondary cells at the same time. Hence, mass scale testing is enabled.

In some embodiments, the racking is configured to receive pouch cells, coin cells, prismatic cells and/or cylindrical cells. Hence, the proposed technique may be used for a variety of different cell types.

In some embodiments, the cabling is at least partly integrated in walls of the enclosure. Hence, cables are protected from damage and tangling, which may cause faulty couplings is avoided.

In some embodiments, the cabling is extending from inside the enclosure, through walls of the enclosure to the cycler interfaces arranged at outer walls of the enclosure. In this way efficient connection between the cyclers and the cells is enabled.

In some embodiments, the movable walk-in chamber is modular such that a plurality of movable walk-in chambers can be stacked on top of or next to each other. Hence, capacity can be scaled up, if needed.

In some embodiments, the preceding claims, wherein the movable walk-in chamber comprises an attachment mechanism arranged to attach cyclers to the outer walls of the enclosure. Hence, the test entire lab may be constructed as one single physical unit and may thereby also be pre-fabricated, whereby installation time is shortened.

In some embodiments, the racking is designed to receive individual cells and/or cells arranged in bundles. Hence, testing may be performed on individual cells or on bundles of cells, depending on test requirements.

In some embodiments, the enclosure forms one thermally isolated chamber. If all testing may be performed at the same temperature, then the enclosure may constitute one "super chamber", which enables efficient temperature control.

In some embodiments, the enclosure is divided into partitions forming a plurality of thermally isolated temperature chambers. Hence, testing under various temperatures is also possible.

In some embodiments, the movable walk-in chamber comprises a temperature and/or climate control mechanism arranged to control temperature inside the at least one thermally isolated temperature chamber. Hence, the test environment may be controlled based on test requirements.

In some embodiments, the entrance comprises a door with a secure locking mechanism. Thereby, a high security level may be maintained in the lab with simple means.

In some embodiments, openable doors are arranged in the outer walls whereby cells may be inserted in the racking and removed from the racking through the openable doors. By providing access to the cells from outside the enclosure the need to let staff into the enclosure housing the cells, is reduced, whereby safety may be increased.

In some embodiments, the movable walk-in chamber comprises one or more sensors arranged inside the enclosure and configured to provide sensor data indicative of a test environment inside the enclosure to the control arrangement. In some embodiments, the one or more sensors comprises one or more of an energy sensor, image sensor, a movement sensor, a gas sensor, a temperature sensor, a humidity sensor etc. Thereby, various aspects of the testing and of the test environment may be monitored centrally.

In some embodiments, the control arrangement is configured to control the cyclers and/or the temperature and/or climate control mechanism based on the sensor data. Hence, the testing may be more or less automated.

BRIEF DESCRIPTION OF THE DRAWINGS

The embodiments disclosed herein are illustrated by way of example, and by not by way of limitation, in the figures of the accompanying drawings. Like reference numerals refer to corresponding parts throughout the drawings, in which

FIG. 5 illustrates the movable walk-in chamber in transverse cross section.

FIG. 6 illustrated the racking in further detail.

FIG. 7 illustrates a cycler interface in further detail.

DETAILED DESCRIPTION

This disclosure introduces a performance and life-cycle testing lab which includes a super-sized testing chamber with racking inside that can house thousands of secondary cells and which is suitable for pre-fabrication. Cyclers performing the testing can be connected to cells inserted in the racking via cycler interfaces arranged on outer walls of the enclosure. The testing lab can be used for production testing of secondary cells for example in a Formation and Ageing, FA, building. The proposed concept improves testing in terms of lowered production time, simplified management of construction/commissioning and in addition reduction of components and complexity.

Embodiments of the present disclosure will now be described more fully hereinafter, with reference to FIGS. 2 to 10. The same reference numbers are used throughout the figures. The present disclosure may, however, be embodied in many different forms and should not be construed as limited to the embodiments set forth herein; rather, these embodiments are provided by way of example so that this disclosure will be thorough and complete, and will fully convey the scope of the present disclosure to those persons skilled in the art.

Figure 1:
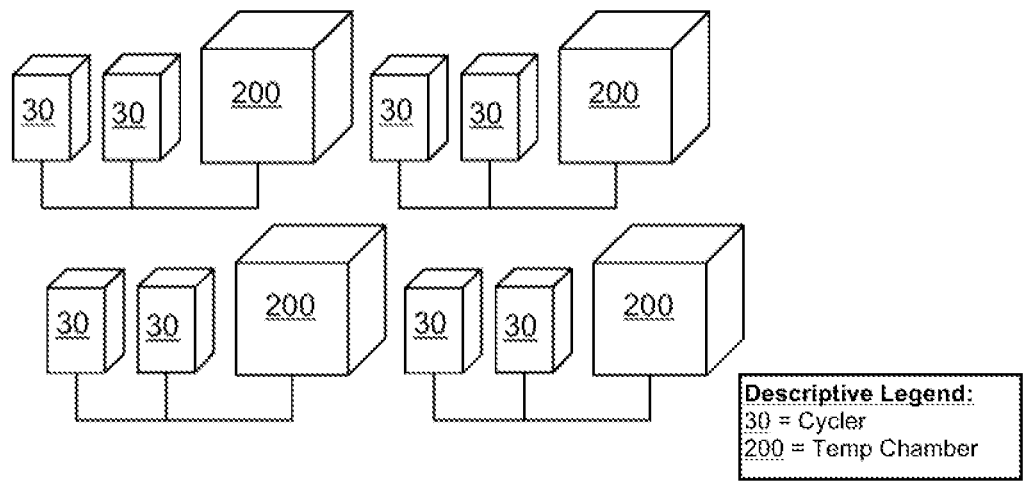
FIG. 1 illustrates P&L testing of secondary cells according to prior art.
Figure 2:
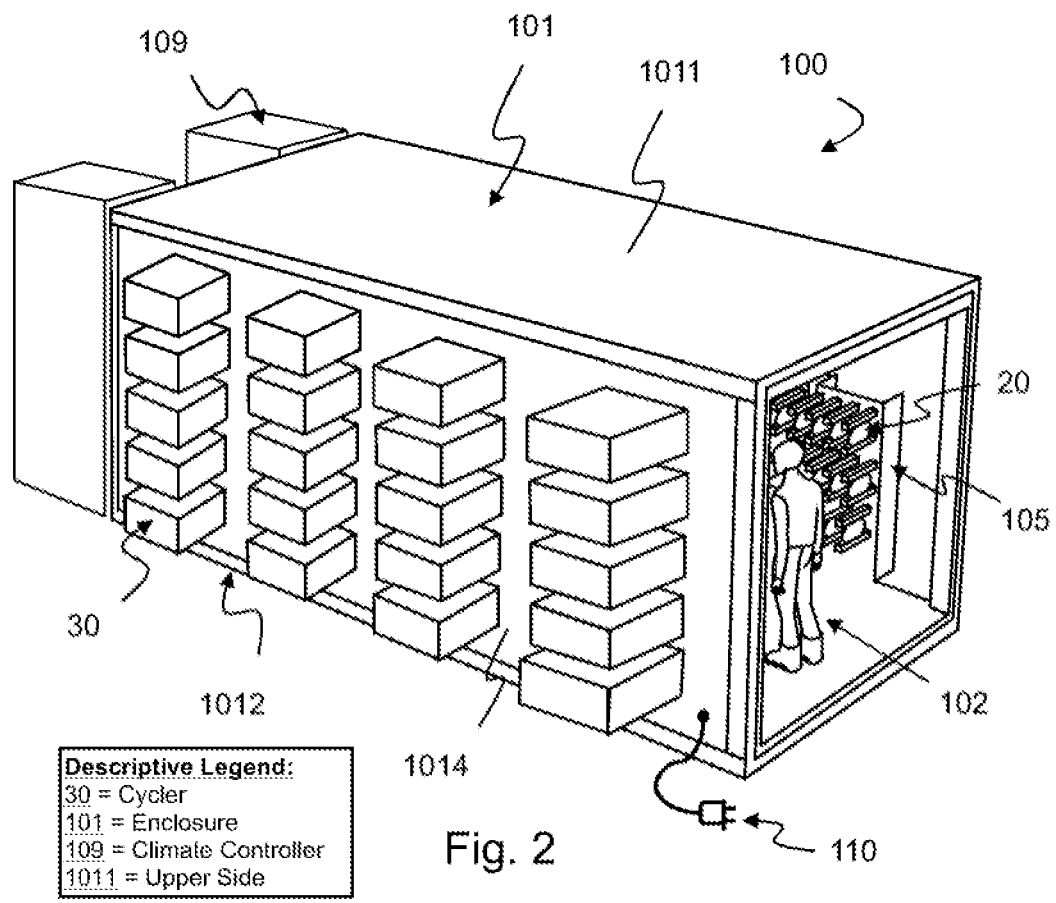
FIG. 2 illustrates the movable walk-in chamber obliquely from above with one short side removed.

FIG. 2 conceptually illustrates the movable walk-in chamber 100, obliquely from above with one short side (FIG. 3) removed, when connected to a plurality of cyclers 30. In the illustrated example, the movable walk-in chamber 100 comprises an enclosure 101 which forms one (huge) thermally isolated temperature chamber. In other words, the enclosure 101 forms a "super chamber" that can accommodate thousands of cells 20 (herein also called simply cells 20) in racking 105 arranged along inner walls 101a of the enclosure 101. Inner walls 101a herein refers to the inside, or inner face, of the walls of the enclosure 101. In the illustrated embodiment the enclosure is rectangular prismatic and has six walls, herein also referred to as sides. However, other shapes are also possible. More specifically, in the illustrated embodiment the enclosure 101 has an upper side 1011, a lower side 1012, two short sides 1013 (see FIG. 3) and two long sides 1014.

The movable walk-in chamber (101) is movable, which means that it can be moved or transported without or with minor disassembly. In some embodiments, the movable walk-in chamber 101 is manufactured off-site in advance, in standard sections that can be easily shipped and assembled. For example, the movable walk-in chamber 101 comprises a floor section 31, one or more middle sections 32 and top section 33 with interfaces for electricity etc. in-between, see FIG. 3. The sections 31, 32, 33 are assembled on-site with a clamping arrangement (such as a bracket or strapping bar) that is for example screwed or welded to keep the movable walk-in chamber (101) in a permanent state. This type of assembly may facilitate retrofitting into existing buildings. Prefabrication is typically desirable due to health and safety, as the number of construction workers needed in the already crowded factories is reduced.

The size of the enclosure 101 is for example 20 feet (length)×8 feet (width)×8.5 feet (height), which corresponds to a standard freight container suitable for stacking. Hence, in some embodiments, the movable walk-in chamber 100 is modular such that a plurality of movable walk-in chambers 100 can be stacked on top of or next to each other. The enclosure 101 may also be slightly smaller or larger. In some embodiments, the enclosure 101 has a size of at least 10(l)*6(w)*2(h) meters or at least 5(l)*3(w)*2(h) meters. Hence, the enclosure forms a chamber where people (e.g. staff) can enter to insert or remove cells 20 from the racking 105. Cyclers 30 used for performing the testing are arranged outside the enclosure. In other words, the cyclers 30 are external cyclers in relation to the enclosure 101.

The enclosure 101 is typically made from one or more solid and heat isolating materials, such as mineral wool, fiberglass, polystyrene, cellulose or polyurethane foam. Thermal insulation implies that transfer of heat through walls of the enclosure 101 is reduced. The movable walk-in chamber 100 further comprises a temperature and/or climate control mechanism 109 configured to control the temperature inside the enclosure 101. The temperature and/or climate control mechanism 109 may be located inside or outside the enclosure 101. The temperature and/or climate control mechanism 109 comprises for example one or more fans and/or coolers, heating elements, compressors, cooling circuits, HVAC, frost free heater and thermostats. Hence, the temperature may be held at a constant temperature such as about 25° C. or 45° C., which is typically sufficient for P&L testing.

Figure 3:
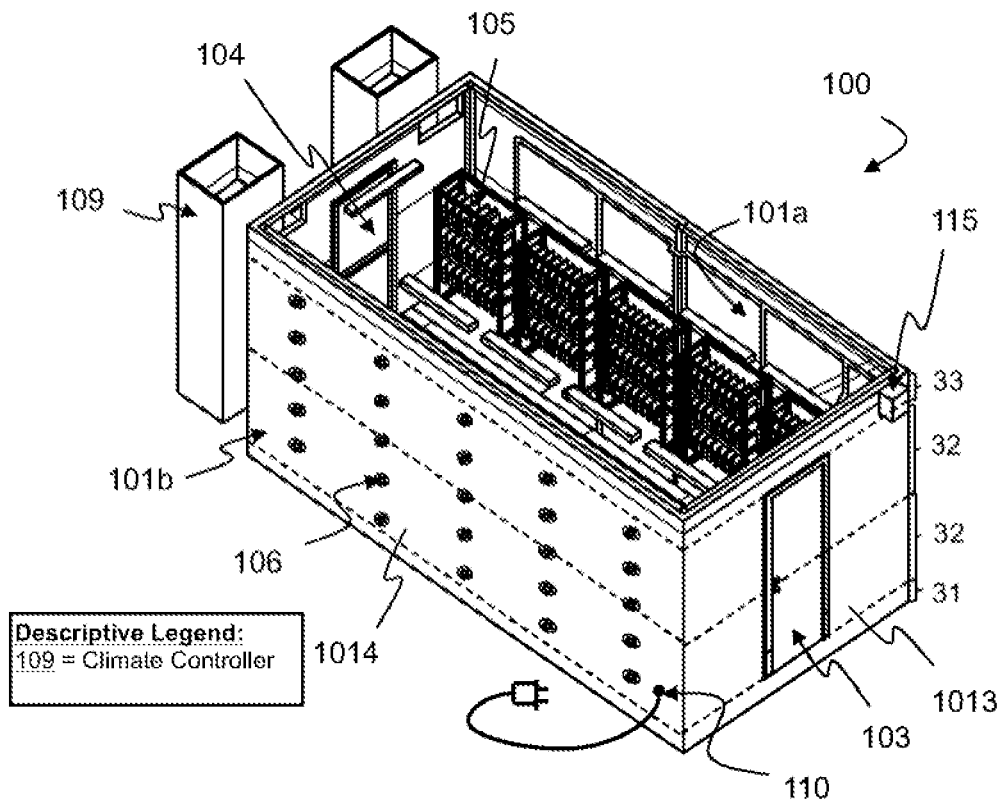
FIG. 3 illustrates the movable walk-in chamber obliquely from above with an upper side removed.
Figure 4:
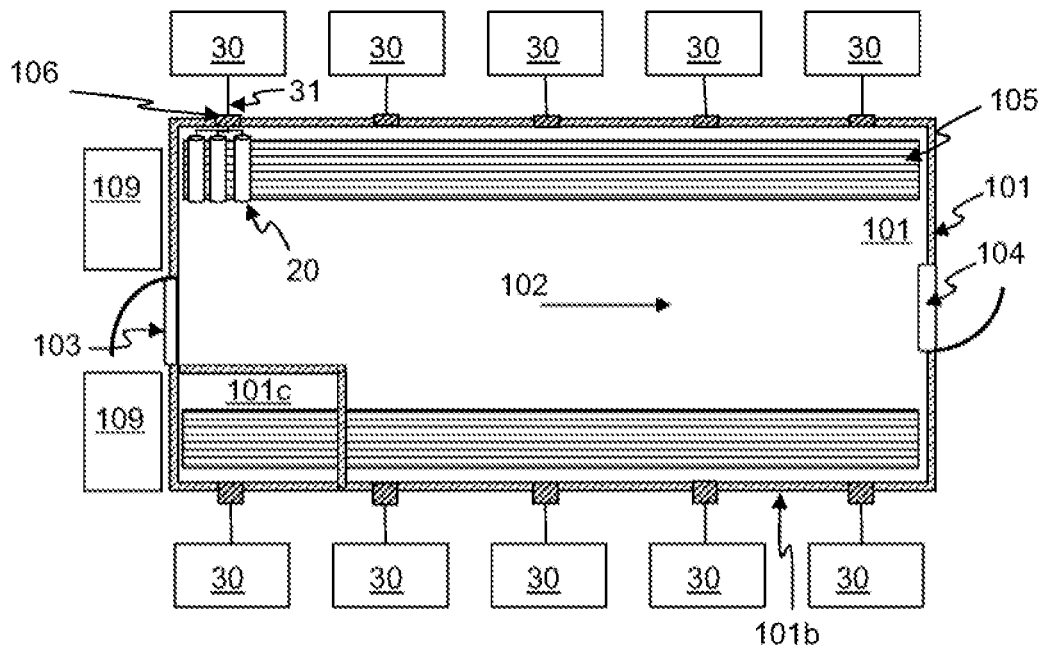
FIG. 4 illustrates the movable walk-in chamber seen from above.

The movable walk-in chamber 10 will now be described in further detail with reference to FIGS. 3 to 5 showing embodiments of the movable walk-in chamber 100 from different angles. FIG. 3 illustrates one embodiment of the movable walk-in chamber 100 obliquely from above with an upper side 1011 removed and without any cyclers 30 connected. FIG. 4 conceptually illustrates one embodiment of the movable walk-in chamber 100, seen from above, with cyclers 30 connected. FIG. 5 illustrates the movable walk-in chamber 100 conceptually in cross section.

The racking is configured or constructed to enable fast connection and disconnection of cells 20. In the illustrated example, the racking 105 is positioned along the long sides 1014 (See FIG. 5) of the enclosure 101 along a walking aisle 102. Thereby, the racking 105 is accessible for someone standing in the walking aisle 102. The racking 105 is typically configured to receive a large number of cells 20, such as at least 500 cells 20, at the same time and possibly even thousands (such as at least 1000 or 2000 cells). The racking 105, may be adapted or arranged to fit different types of cells 20, such as pouch cells, coin cells, prismatic cells and/or cylindrical cells. In some embodiments, different parts of the racking 105 may be designed or constructed to receive different types of cells 20. Furthermore the racking 105 may be is designed to receive individual cells and/or groups of cells, such as cells 20 arranged in bundles, such as packs of batteries. The external cyclers 30 are connected to cells 20 inserted in the racking via cycler interfaces 106 arranged in the walls of the enclosure 101.

The enclosure 101 has an entrance 103 and an exit 104 arranged on opposite short sides 1013 of the enclosure. Thus, an operator may enter the entrance 103 for inserting a cell 20 in the racking 105 for testing and proceed to the exit 104. Hence, the walking aisle 102 is arranged between an entrance 103 and an exit 104. In an alternative embodiment, the entrance 103 and the exit 104 are formed by one single opening in the enclosure 101.

The movable walk-in chamber 100 typically constitutes a security area, as it houses a large number of high-power cells 20. Hence, in some embodiments the entrance 103 comprises a door with a secure locking mechanism. Thereby, only authorized staff are allowed to enter the movable walk-in chamber 100. The exit 104 typically also comprises a door, that can typically only be opened from the inside. Testing of cells 20 may also be associated with fire hazard. Hence, in some embodiments the enclosure 101 constitutes a fire cell of a certain grade. In addition the doors of the entrance 103 and exit 104 may be fire doors. In addition the enclosure 101 may be equipped with further fire protection equipment such as a dedicated fire detector, sprinkler system etc.

The racking 105 is arranged at inner walls 101a of the enclosure 101 along the walking aisle 102. The cyclers 30 are arranged outside the enclosure 101. Thus, when a secondary cell 20 shall be tested it is inserted in the racking 501. The secondary cell 20 is then connected to one of the external cyclers 30 via one of the cycler interfaces 106 arranged at outer walls 101b of the enclosure 101. The connection may be automatically achieved when the cell 20 is correctly inserted in the racking 105. Outer walls 101b herein refers to an outside, or outer face, of the walls of the enclosure 101.

In the illustrated embodiment, the cycler interfaces 106 are arranged along long sides 1014 of the enclosure. In other embodiments, the cycler interfaces 106 are in addition or alternatively arranged on short sides 1013 or on the upper side 1011 of the enclosure 101.

Because footprint in the factory area is typically an important aspect, the cyclers 30 are typically distributed around the enclosure 101 as close to the enclosure 101 as feasible. In order to reduce need of external cabling 31 between the cyclers 30 and the cycler interfaces 106, the cycler interfaces 106 should typically also be distributed around the enclosure 101. In other words, in some embodiments, the cycler interfaces 106 are distributed along the outer walls 101b of the enclosure 101 with a certain distance, corresponding to the width of one cycler 30, in-between. The certain distance is for example equal to width or height of a standard cycler plus/minus 20 cm.

The cycler interfaces 106 are configured to connect externally arranged cyclers 30 to the movable walk-in chamber 100. One cycler interface 106 typically provides different types of connections, such as a power connection, a communication connection and connections for the testing, herein referred to as (test) channels. More specifically, one cycler interface 106 can typically provide channels between one connected cycler 30 and a plurality of cells 20. In other words, the cycler interfaces 106 are configured to electrically connect a plurality of cyclers 30 arranged outside the enclosure 101 to cells 20 inserted in the racking 105.

Various types of cabling 107 (where a, b, c denotes the different types) is used to connect the cycler interfaces 106 to various components of the movable walk-in chamber 100. In some embodiments, the cabling 107 is extending from inside the enclosure 101, through walls of the enclosure to the cycler interfaces 106 arranged at outer walls 101*b* of the enclosure. Cabling 107 may also extend along the outer walls 101*b* of the enclosure.

In some embodiments, the cabling is at least partly arranged in walls of the enclosure 101. The cyclers 30 may be attached to the cycler interfaces 106 by external cabling 31. The cycler interfaces 106 will be described in further detail in FIG. 7 and the cabling 107 will be described in further detail in FIGS. 7 and 8.

In P&L testing it may be sufficient to test cells at a fairly static temperature of for example 25° C. However, sometimes it may be desirable to also test at higher and or lower temperatures. This may be achieved by forming thermally isolated sub chambers or partitions 101*c* inside the enclosure. For example, one or more cubicles (e.g. made from fiber glass) are arranged in corners of the enclosure 101. In one example embodiment a high temperature (25° C. more) sub chamber is arranged in one corner and a low temperature (25° C. less) sub chamber in another sub chamber at an opposite short side 1013 (FIG. 3) of the enclosure. In other words, in some embodiments the enclosure 101 is divided into partitions 101*c* forming a plurality of thermally isolated temperature chambers. In other embodiments, doors (e.g. sliding) may be arranged in front of the racking 105, whereby a thermally isolated chamber is formed behind the doors, i.e. where the cells 20 are located. In these embodiments, a part of the enclosure 101 may not be thermally isolated.

To achieve a compact design and to enable pre-fabrication it may be desirable to attach the cyclers 30 to the enclosure. This may be done by an attachment mechanism 113 comprising for example compartments or shelves arranged at the outer walls 101*b* of the enclosure. In FIG. 5 cyclers 30 are arranged in a shelf framework attached at long sides 1014 (FIG. 3) of the enclosure. In other embodiments the attachment mechanism 113 may be configured to attach the cyclers on the upper side 1011 of the enclosure. In other words, in some embodiments the movable walk-in chamber 100 comprises an attachment mechanism 113 arranged to attach cyclers 30 to the outer walls 101*b* of the enclosure 101.

Figure 9:
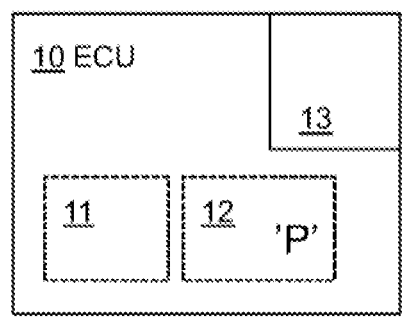
FIG. 9 illustrated a control arrangement for controlling the movable walk-in chamber.

The testing and the test environment may be automatically controlled. For this purpose various sensors 111 may be used. Hence, in some embodiments, the movable walk-in chamber 100 comprises one or more sensors 111 arranged inside the enclosure and configured to provide sensor data indicative of a test environment inside the enclosure 101 to a control arrangement 10 (FIG. 9). The control arrangement may be located inside or outside the enclosure 101. Various sensors may be used such as energy sensors, image sensors, movement sensors, gas sensors, temperature sensors, humidity sensors etc.

For efficient testing, time efficient and secure insertion and removal of cell 20 is a key aspect. Hence, it is important that the cell 20 cannot be accidently removed during testing. In other words, in some embodiments, the racking 105 comprises a cell fixturing mechanism 105*a* for fixating cell in the racking 105, see FIG. 6 illustrating the racking 105 in more detail. The racking comprises slots 105*c*, where one slot 105*c* is configured to receive one individual cell 20 or a bundle of cells. Each slot 105*c* comprises a cell fixturing mechanism 105*a* and electrical connectors 105*b*. The cell fixturing mechanism 105*a* comprises for example a guiding mechanism, such as rails or bars and a fastening mechanism, such as a clamp, spring, jumper. The racking 105 also comprises electrical connectors 105*b* providing an electrical connection between the cycler interfaces 106 and (poles +/− of) cells 20 fixated in the cell fixturing mechanism. More specifically, when a secondary cell 20 is fixated in the cell fixturing mechanism 105*a*, the electrical connector 105 provides connections between the poles +, − of the cell 20 and a channel (i.e. a port for one cell) of a cycler 30 connected to the corresponding cycler interface 106. Hence, the fixturing mechanism 105*a* and the electrical connector 105*b* is a docking mechanism that enables fixturing and connecting cell to the cyclers 30 via the cycler interfaces 106. In some embodiments, sensors 111*a*, such as voltage sensors, power sensors or temperature sensors, are arranged at the electrical connectors 105*b*. These sensors 111*a* may be useful for monitoring and controlling the testing.

The cell fixturing mechanism 105*a* may be adapted to different cell types, such as to pouch cells, coin cells, prismatic cells or cylindrical cells. For example, racking 105 along one side wall (upper one in FIG. 4) may be configured to receive prismatic cells while the opposite side wall may be configured to receive cylindrical cells.

FIG. 7 illustrates one cycler interface 106 in further detail. One cycler interface comprises several different types of sub interfaces or terminals. The illustrated cycler interface 106 comprises a power interface 106*a*, a communication interface 106*b* and one or more cell interfaces 106*c*. Each sub interface is a terminal for a certain type of electrical signal, such as for power or communication. Each interface 106*a*, 106*b*, 106*c* may comprise one or more contact points that permit the attachment of a wire, such as pins. The connectors may be arranged in one or several plugs, sockets or similar.

The power interface 106*a* is configured to supply power from the movable walk-in chamber 100 to a connected cycler 30. Thus, cabling 107*a* is arranged to connect the power interfaces 106*a* to at least one central power connector 110, whereby cyclers 30 connected to the cycler interfaces 106 can be powered from the movable walk-in chamber 100. The power interface 106*a* may comprise one or more plugs or sockets for DC-power (e.g. 42V) or AC power. The at least one power connector 110 is used to power all the cyclers 30 from a common power source, such as from a grid or battery.

The communication interface 106*b* is configured to enable communication between the movable walk-in chamber 100 and a connected cycler 30. Hence, in some embodiments, cabling 107*b* is arranged to connect each cycler interface 106 to a control arrangement 10 controllable by a central user interface 108, whereby cyclers 30 connected to the cycler interfaces 106 can be controlled by the central user interface 108. The communication interface 106*b* is for example an Ethernet connector or other suitable communication connector. The user interface 108 will be described in further detail in FIGS. 9 and 10.

The cell interfaces 106*c* are configured to connect cell 20 inserted in the racking 105 to a cycler 30, such that testing may be performed. More specifically, each cell interface 106*c* is configured to connect the poles (positive and negative) of one secondary cell 20 inserted in the racking to one test channel of a cycler 30. The cell interfaces 106*c* typically comprises a connector for DC power. Cabling 107*c* is also arranged to connect the cell interfaces 106*c* to poles of secondary cells 20 inserted in the racking 105, whereby cyclers 30 connected to the cycler interfaces 106*c* are able to perform testing on cells arranged in the racking 105. The cabling 107*c* that connect the cell interfaces 106*c* to the poles of secondary cells 20 typically extends through walls of the enclosure 101, for example through one or more holes in the walls. Several cables may extend through the same hole, but for fire safety it may be more efficient to have one hole per cable. This would mean that for each cell 20 at least two holes are required, one for the positive terminal and one for the negative terminal.

Figure 8:
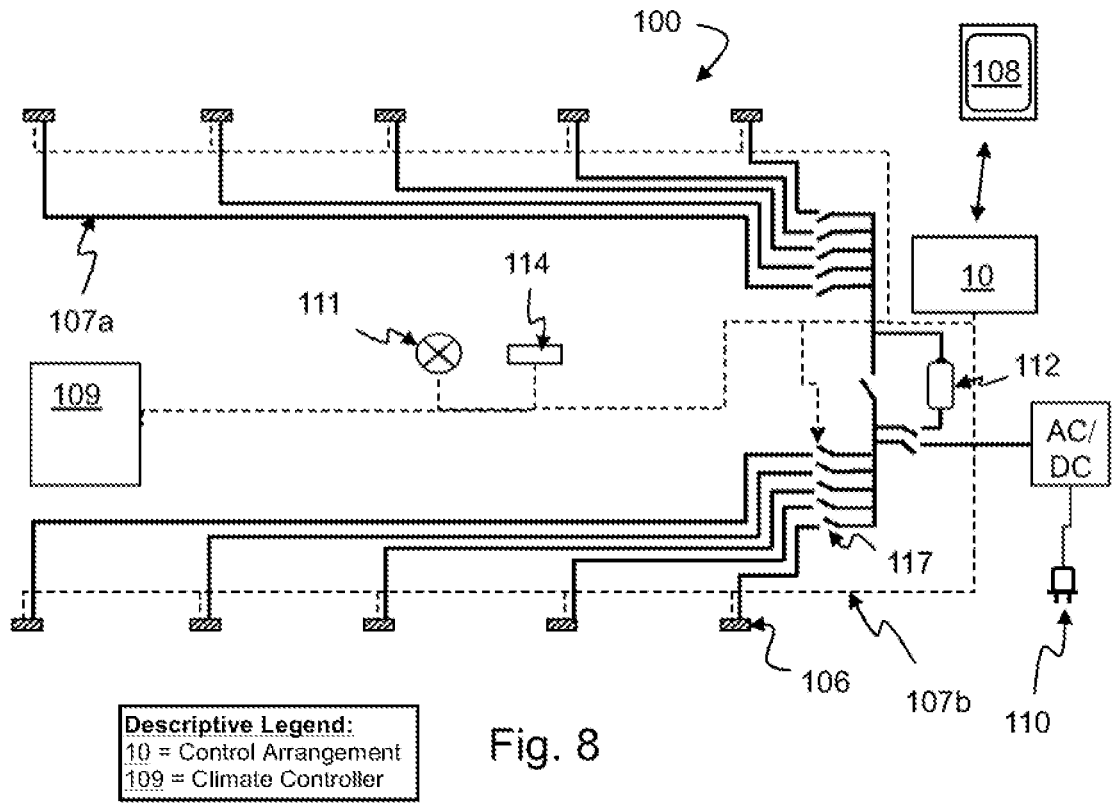
FIG. 8 illustrates electrical couplings of the movable walk-in chamber.

FIG. 8 illustrates electrical components and couplings of the movable walk-in chamber 100, such as the cycler interfaces 106, the cabling 107 and a control arrangement 10, in more detail. In some embodiments, the movable walk-in chamber 100 additionally comprises further electrical components such as a power storage 112, at least one central power connector 110, a wireless access point 114, one or more sensors 111 and a user interface 108. Note that the cabling 107c arranged to connect the cell interfaces 106c to poles of secondary cells 20 is not shown in FIG. 8.

The cabling 107 comprises electrical conductors arranged to connect the electrical components of the movable walk-in chamber 100. The cabling 107 comprises power cabling 107a (thick line) and communication cabling 107b (dashed line). In some embodiments, the cabling 107 is at least partly integrated in walls of the enclosure 101. Some cabling 107, such as the power cabling 107a or the communication cabling 107c, may also extend along the outer walls 101b, as it does not need to be connected to the cells 20 located inside the enclosure 101.

The power cabling 107a is arranged to connect the power interfaces (FIG. 7) of the cycler interfaces 106 to the power storage 112 and/or to the at least one central power connector 110, via an AC/DC converter. The power cabling 107a forms a DC bus. Thereby, the cyclers 30 can be powered by the power storage 112 and/or by a power grid connected to the central power connector 110. A plurality of power switches 117 are arranged to connect and or disconnect one or more of the individual cycler interfaces 106, the power storage 112 and or to the central power connector 110 to, or from, the DC bus. Thereby, flexible power control in enabled. If bi-directional cyclers are used, a surplus from discharging one cell 20 during testing, can be fed back to the DC bus and used to charge another cell 20 in another test. The surplus may alternatively be stored in the power storage 112. In other words, in some embodiments, the cabling 107 is arranged to form a connection between the cycler interfaces 106 such that energy recovered when discharging one secondary cell 20 can be used to charge another secondary cell 20. The power cabling 107a does not need to extend through the walls of the enclosure, but may be arranged externally along the outer walls 101b of the enclosure. For example, the power cabling may be attached on the outer walls 101b. In the illustrated embodiment, the cyclers 30 are powered by DC current. It shall be appreciated that the cyclers may alternatively be powered by AC current and the power cabling 107a may then form an AC bus. In these embodiments, the cyclers 30 comprises an internal AC/DC converter.

The communication cabling 107b is arranged to connect various components to the control arrangement 10. In some embodiments, the communication cabling 107b also configured to connect the control arrangement to cyclers 30 connected to the cycler interfaces 106 and to a common user interface 108. In other words, in some embodiments, the cabling 107b is arranged to connect each cycler interface 106 to a central user interface 108 whereby cyclers 30 connected to the cycler interfaces 106 can be controlled from the central user interface 108. The communication cabling 107b may also connect the temperature and/or climate control mechanism 109 to the control arrangement 10, whereby the control arrangement 10 can control the temperature and/or climate control mechanism 109.

In some embodiments, the communication cabling 107b is arranged to connect the one or more sensors 111 to the control arrangement 10, such that the control arrangement may receive sensor data. The sensor data may be indicative of various parameters relevant to testing, such as temperature, humidity etc. in the enclosure 101 or temperature or energy level at the interfaces 106. In some embodiments, the control arrangement 10 is configured to control the cyclers 30 and/or the temperature and/or climate control mechanism 109 based on the sensor data.

The communication cabling 107b may also connected to the wireless access point 114. The wireless access point is for example a wireless router that may enable wireless communication using e.g. WiFi or any 3GPP standard inside the enclosure 101.

The communication cabling 107b may also be connected to a fire protection system 115 (FIG. 3) including fire doors, alarm, sprinklers etc. and to doors and locks of the entrance 103 and exit 104.

FIG. 9 illustrates a control arrangement 10 of the movable walk-in chamber 100 in more detail. In some embodiments, the control arrangement in a "units" in a functional sense. Hence, in some embodiments the control arrangements 10 may comprise several physical control devices that operate in corporation.

The control arrangement 10 comprises a processor 11, memory 12 and a communication interface 13. The control arrangement 10, or more specifically the processor 11 of the control arrangement 10, is configured to cause the control arrangement 10 to monitor and control the testing. This is typically done by running computer program code stored in the data storage or memory 12 in the processor 11 of the control arrangement 10. The data storage 12 may also be configured to store static and semi-static parameters, such as test parameters. The communication interface 13 enables communication with the connected devices. The communication interface 13 is for example an ethernet modem.

The control arrangement 10 is configured to provide a user interface 108 to enable two-way communication with a user. The user interface 108 is for example a graphical user interface rendered on a display connected to the control arrangement, such as on a computer, smartphone, tablet, or other display. The user may input data via the user interface, such as to configure test parameters of one or more cells 20. For example the cyclers 30 are programed to charge and discharge a cell a certain number of times.

The user interface 108 may also be used to set a temperature of the one or more thermally isolated chambers or other climate parameters, such as humidity or air quality requirements. Based on the user data the control arrangement 10 may send a control signal to the cyclers 30 to for example start or stop testing. When a test is completed test results may be provided to the user via the user interface 108.

The control arrangement 10 may also be configured to receive sensor data from the sensors 111. Based on the sensor data the control arrangement 10 may control the testing and/or the temperature and/or climate mechanism 109. For example, the control arrangement 10 may be configured to stop a test if the temperature inside the enclosure exceeds a certain threshold or if a fire is detected. In other words, the control arrangement 10 may be configured to perform safety detection and trigger appropriate actions.

The control arrangement 10 may also be configured to detect motion inside the movable walk-in chamber 100 and perform various action in response to detecting certain or abnormal motion, such as triggering an alarm. For example, gas or motion due to a cell 20 popping may trigger an alarm, which may be sent via the user interface 108. The control arrangement 10 may also receive sensor data from heat cameras.

In some embodiments, the control arrangement 10 is configured to control a smart lock of the entrance 103, such that access to the movable walk-in chamber 100 is restricted. The control arrangement 10 may also be configured to control a robotic cleaner attached to the access point 114. A need for cleaning may for example be detected by monitoring sensor data from an image sensor, whereby cleaning operation may be triggered when required and feasible, such as when there is no people inside the movable walk-in chamber 100.

Figure 10:
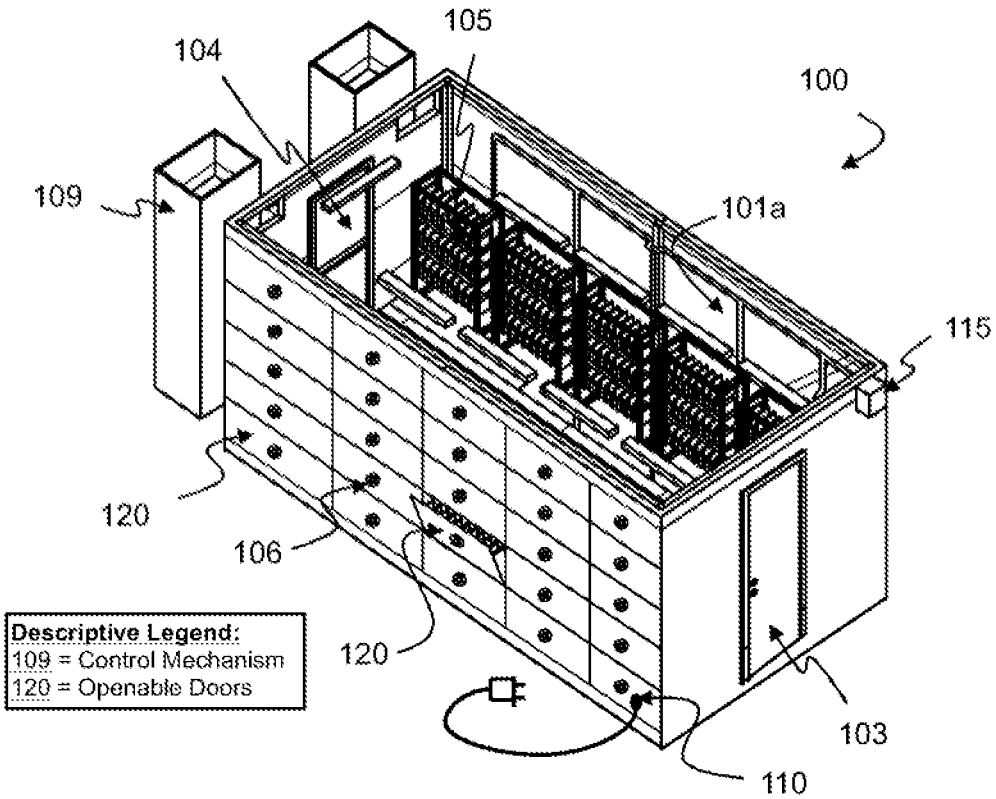
FIG. 10 illustrates a movable walk-in chamber with racking accessible from the outside.

In some embodiments the movable walk-in chamber 100 may in addition have loading access from outside. FIG. 10 illustrates a movable walk-in chamber with racking accessible from the outside. In the illustrated embodiments, tiltable doors 120 are arranged on the outer walls of the enclosure 100. By opening the tiltable doors 120 cells 20 may be inserted and removed from outside the movable walk-in chamber 100. In other words, in some embodiments, openable doors 120 are arranged in the outer walls 101b whereby cells 20 may be inserted in the racking 105 and removed from the racking through the openable doors 120. In the illustrated example, the doors 120 are tiltable doors 120. Alternatively, the access to the racking 105 may be provided by drawers or any other type of doors.

Figure 11:
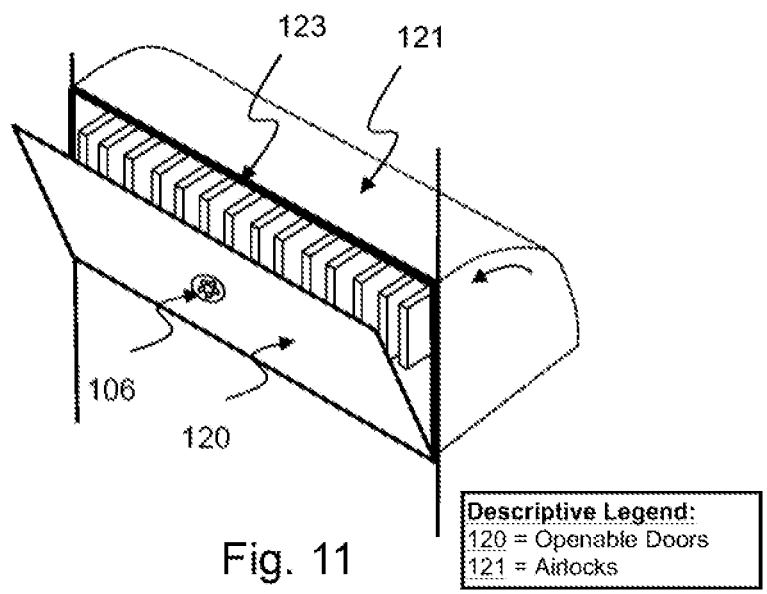
FIG. 11 illustrates an openable door providing access to the racking in more detail.

FIG. 11 illustrates an openable door in more detail. The openable door 120 is typically sealed, such as by a gasket 123 (thicker line), in order to maintain thermal isolation. In addition airlocks 121 may be arranged to prevent air from flowing into the enclosure 101, when the openable doors 120 are open. Thereby, the temperature inside the enclosure may be maintained. Additional clamping (not illustrated) may be arranged on the cells 20 to assure that the cells 20 remain fixated when the openable doors 120 are opened. In some embodiments, the openable doors 120 are equipped by secure locking that can be controlled by the control arrangement 10. A user that wants to test a cell 20 may then insert test data via the user interface 108. The control arrangement 10 may then automatically select a suitable slot 105c (FIG. 6) in the racking 105, and automatically open a corresponding openable door 120, whereby the user may easily insert the cell 20 in the right place. The particular slot for the cell 20 may be indicated by for example a light diode.

The cycler interfaces 106 may be arranged on the openable doors 120, as illustrated in FIG. 10. Although, having lots of holes in one door could be mechanically challenging for the design as cables are thick and not so flexible. Hence, in some embodiments the holes (i.e. cable entry points) are arranged to the side of the openable doors 120, in the wall of the enclosure 101.

The access mechanism typically have to be thermally isolated, whereby a stable temperature can be maintained when it is closed. Even if the cells 20 may be accessed from the outside, there is typically anyway a need to now and then enter the movable walk-in chamber 100 in order to perform maintenance, repair etc. However, as there may be risks associated with entering a room comprising many high-power cells 20 it may be advantageous to minimize the number of visits and to limit the number of people that need to access the movable walk-in chamber 100.

It shall also be appreciated that even if the movable walk-in chamber 100 and the walking aisle 102 have been described with reference to human beings entering the movable walk-in chamber 100 it must be appreciated that it may in some embodiments be feasible to let some work performed inside the movable walk-in chamber 100 be performed by robots. Hence, autonomous robots may be deployed to for example insert and remove cells 20 for testing. Such robots may either operate autonomously on the floor. Alternatively, some trails or tracks may be arranged inside the movable walk-in chamber 100.

The proposed technique has been described with reference to lithium-ion cells, but it should be appreciated that the movable walk-in chamber may be used to test other types of cells including cells made from solid state materials, such as graphene. Such cells are expected to be more commonly used in the future.

The terminology used in the description of the embodiments as illustrated in the accompanying drawings is not intended to be limiting of the described method, control arrangement or computer program. Various changes, substitutions and/or alterations may be made, without departing from disclosure embodiments as defined by the appended claims.

The term "or" as used herein, is to be interpreted as a mathematical OR, i.e., as an inclusive disjunction; not as a mathematical exclusive OR (XOR), unless expressly stated otherwise. In addition, the singular forms "a", "an" and "the" are to be interpreted as "at least one", thus also possibly comprising a plurality of entities of the same kind, unless expressly stated otherwise. It will be further understood that the terms "includes", "comprises", "including" and/or "comprising", specifies the presence of stated features, actions, integers, steps, operations, elements, and/or components, but do not preclude the presence or addition of one or more other features, actions, integers, steps, operations, elements, components, and/or groups thereof. A single unit such as e.g. a processor may fulfil the functions of several items recited in the claims.

The invention claimed is:

1. A movable walk-in chamber for testing secondary cells, the movable walk-in chamber comprising:
    an enclosure having at least two short sides and two long sides, wherein each of the two short sides has a width that is less than each of the two long sides, the enclosure forming at least one thermally isolated temperature chamber, wherein the enclosure comprises a walking aisle,
    two sets of racking, each racking arranged along a respective inner wall of the two long sides of the enclosure along the walking aisle, into which
    a plurality of secondary cells can be inserted for testing and removed after testing, a plurality of cycler interfaces arranged at outer walls of the enclosure of the movable walk-in chamber, wherein each cycler interface comprises a power interface and one or more cell interfaces configured to connect secondary cells removably inserted in the racking to cyclers,
    cabling arranged to electrically connect the power interfaces of the plurality of cycler interfaces to at least one central power connector, whereby cyclers connected to the cycler interfaces can be powered from the movable walk-in chamber, and
    cabling arranged to electrically connect the cell interfaces of the plurality of cycler interfaces to poles of secondary cells inserted in the racking, whereby the cyclers connected to the cycler interfaces are able to perform testing on cells arranged in the racking.

2. The movable walk-in chamber according to claim 1, wherein each cycler interface comprises a communication interface and wherein the movable walk-in chamber comprises cabling arranged to connect the communication interfaces to a control arrangement controllable by a central user interface, whereby cyclers connected to the cycler interfaces can be controlled by the central user interface.

3. The movable walk-in chamber according to claim 1, wherein the cabling is arranged to form a connection between the individual power interfaces, such that energy recovered when discharging one secondary cell can be used to charge another secondary cell.

4. The movable walk-in chamber according to claim 1, wherein the cycler interfaces are distributed along the outer walls of the enclosure with a certain distance, corresponding to the width of one cycler, in-between.

5. The movable walk-in chamber according to claim 1, wherein the racking comprises a cell fixturing mechanism for fixating secondary cells in the racking and an electrical connector providing an electrical connection between the cycler interfaces and secondary cells fixated in the cell fixturing mechanism.

6. The movable walk-in chamber according to claim 1, wherein the racking is configured to receive at least 500 secondary cells at the same time.

7. The movable walk-in chamber according to claim 1, wherein the racking is configured to receive pouch cells, coin cells, prismatic cells and/or cylindrical cells.

8. The movable walk-in chamber according to claim 1, wherein the cabling is at least partly integrated in walls of the enclosure.

9. The movable walk-in chamber according to claim 1, wherein the cabling is extending from inside the enclosure, through walls of the enclosure to the cycler interfaces arranged at outer walls of the enclosure.

10. The movable walk-in chamber according to claim 1, wherein the movable walk-in chamber is modular such that a plurality of movable walk-in chambers can be stacked on top of or next to each other.

11. The movable walk-in chamber according to claim 1, wherein the movable walk-in chamber comprises an attachment mechanism arranged to attach cyclers to the outer walls of the enclosure.

12. The movable walk-in chamber according to claim 1, wherein the enclosure forms one thermally isolated chamber.

13. The movable walk-in chamber according to claim 1, wherein the enclosure is divided into partitions forming a plurality of thermally isolated temperature chambers.

14. The movable walk-in chamber according to claim 1, comprising:
   temperature and/or climate control mechanism arranged to control temperature inside the at least one thermally isolated temperature chamber.

15. The movable walk-in chamber according to claim 1, wherein the entrance comprises a door with a secure locking mechanism.

16. The movable walk-in chamber according to claim 1, comprising one or more sensors arranged inside the enclosure and configured to provide sensor data indicative of a test environment inside the enclosure to the control arrangement.

17. The movable walk-in chamber according to claim 16, wherein the sensors comprises one or more of an energy sensor, an image sensor, a movement sensor, a gas sensor, a temperature sensor, a humidity sensor etc.

18. The movable walk-in chamber according to claim 16, wherein the control arrangement is configured to control the cyclers and/or the temperature and/or climate control mechanism based on the sensor data.

19. The movable walk-in chamber according to claim 1, wherein openable doors are arranged in the outer walls whereby cells may be inserted in the racking and removed from the racking through the openable doors.

20. The movable walk-in chamber according to claim 1, wherein the walking aisle is arranged between the racking that is arranged along the vertical walls of each of the two long sides of the enclosure.

21. The movable walk-in chamber according to claim 1, wherein the plurality of cycler interfaces are arranged at outer walls of the two long sides of the enclosure.

* * * * *